US012772405B2

(12) United States Patent
Zhu et al.

(10) Patent No.: US 12,772,405 B2
(45) Date of Patent: Oct. 20, 2026

(54) REPEATEDLY, QUICKLY AND REMOVABLY CONNECTABLE RETAINING DEVICE

(71) Applicant: FOSITEK CORPORATION, New Taipei City (TW)

(72) Inventors: Han Cheng Zhu, New Taipei City (TW); Ya Chih Huang, New Taipei City (TW)

(73) Assignee: Fositek Corporation, New Taipei City (TW)

( * ) Notice: Subject to any disclaimer, the term of this patent is extended or adjusted under 35 U.S.C. 154(b) by 160 days.

(21) Appl. No.: 18/676,797

(22) Filed: May 29, 2024

(65) Prior Publication Data

US 2025/0311134 A1 Oct. 2, 2025

(30) Foreign Application Priority Data

Mar. 29, 2024 (TW) ................................ 113112136

(51) Int. Cl.
*H05K 7/14* (2006.01)

(52) U.S. Cl.
CPC .................................. *H05K 7/1404* (2013.01)

(58) Field of Classification Search
CPC .................................................... H05K 7/1404
USPC .......................................................... 361/752
See application file for complete search history.

(56) References Cited

U.S. PATENT DOCUMENTS

| | | | | | |
|---|---|---|---|---|---|
| 6,498,731 | B1 * | 12/2002 | Roscoe | H05K 7/1431 361/801 |
| 6,702,598 | B1 * | 3/2004 | Lo | H01R 12/7005 439/328 |
| 2003/0148646 | A1 * | 8/2003 | Frantum, Jr. | H01R 12/7005 439/157 |
| 2018/0092234 | A1 * | 3/2018 | Wang | H05K 7/1409 |
| 2022/0069550 | A1 * | 3/2022 | Ofenloch | H05K 7/14 |

FOREIGN PATENT DOCUMENTS

TW M605896 U 12/2020

* cited by examiner

*Primary Examiner* — Hung S. Bui
(74) *Attorney, Agent, or Firm* — Rosenberg, Klein & Lee

(57) ABSTRACT

A retaining device includes a seat and a swingable clamp member. The seat is repeatedly, quickly and removably connectable to a predetermined substrate and has a stop section transversely extending over an open topped receiving space thereof, and the swingable clamp member has a middle section pivotally connected to the seat to be received in the open topped receiving space. The swingable clamp member has a clamping recess and a push section located at its front and rear ends, respectively; and a recessed section located between the clamping recess and the push section. When an electronic card has a free edge downward pressed against the clamping recess, the clamping recess can swing downward to clamp the free edge of the electronic card thereto. The push section can be pressed to tip up the clamping recess, so that the electronic card is released from the retaining device.

12 Claims, 4 Drawing Sheets

REPEATEDLY, QUICKLY AND REMOVABLY CONNECTABLE RETAINING DEVICE

FIELD OF THE INVENTION

The present invention relates to a retaining device that can be repeatedly, quickly and removably connected to a substrate, and more particularly, to an electronic card retaining device that is simple in structure, easy and convenient for use, and space-saving.

BACKGROUND OF THE INVENTION

The conventional solid state drive (SSD) uses mSATA standard, which has limited overall capacity because the number of flash memories that can be provided on the printed circuit board (PCB) is limited. Therefore, a more recent standard named Next Generation Form Factor (NGFF) or M.2 is developed for using with solid state drive. Since M.2 standard allows flash memory chips to be provided on both sides of the circuit board, it has advantages like smaller volume, higher capacity, and lower manufacturing cost, compared to the conventional mSATA standard.

General solid state drive with M.2 standard has various length specifications available for choosing, and the motherboard for a computer may also be designed to allow for solid state drive of different length specifications. In response to the need of fixing solid state drives of different length specifications in place, in most cases, the solid state drives with M.2 standard are fastened to the computer motherboard by screws and bolts. However, the use of screws and bolts as fastening means will cause a lot of inconveniences in assembling and disassembling the solid state drives to and from the motherboard. Further, bolts must be embedded in the computer motherboard for the screws to fasten thereto. This would inevitably result in increased manufacturing cost. Therefore, it is an important issue for relevant manufacturers to workout a way of upgrading the efficiency in assembling the M.2 solid state drive to the motherboard while reducing the overall manufacturing cost.

Taiwan Patent Pub. No. I568334 discloses an assembling fastener structure, which includes a loading section, a pivotally connecting section, a protruding section, and a retaining and pressing section. The loading section includes a loading surface and a back surface opposing to the loading surface. The pivotally connecting section and the protruding section are projected from the back surface and the loading surface of the loading section, respectively, to extend along an axial direction of the pivotally connecting section. The retaining and pressing section is radially protruded from one side of the protruding section to extend along a radial direction of the pivotally connecting section, so that the retaining and pressing section and the loading section together form a retaining groove between them, and a release opening not covered by the retaining and pressing section is formed at a diametrically opposite side of the retaining groove.

In the above assembling fastener structure, the pivotally connecting section can be easily snapped into an assembling hole on a circuit board. Further, with the retaining and pressing section that circumferentially encloses almost one half of the protruding section, an operator is able to mount and dismount an expansion component simply by turning the assembling fastener structure less than one circle in case of requiring a solid state drive of different length specification and to upgrade the efficiency in assembling components on the motherboard. In addition, since the above assembling fastener structure is snapped onto the circuit board, no screw and matching bolt are needed to be embedded in the mounting hole on the circuit board to thereby further reduce the material cost of the motherboard.

However, to use the above assembling fastener structure, a tool such as a slotted screwdriver is needed to extend into an operating slot pre-formed on the protruding section to turn the protruding section of the assembling fastener structure until one of the opposing retaining groove and release opening is oriented to the solid state drive, so as to set the assembling fastener structure to a locking or a releasing state. Since the above assembling fastener structure must be operated with a specific tool, i.e. the slotted screwdriver, it is not so convenient for use.

Taiwan Patent Pub. No. I693332 discloses a latch, which includes a base, a push button, and an elastic element. The base has a case, a primary fixing section, a secondary fixing section, and an unlocking handle. The case defines an internal receiving space and has a window provided on each of two sides. The primary and the secondary fixing section are protruded from one side of the case; and the primary fixing section has two wing sections diametrically symmetrically extended outward from an outer surface thereof; and the unlocking handle is connected to the secondary fixing section. The push button is pivotally connected to the base and includes a pressing section for operating the unlocking handle and a locking section for locking an object thereto. The elastic element is disposed between the push button and the base. The push button is rotatable between a locking position and an unlocking position relative to the base, and is biased toward the locking position by the elastic element.

To use the above latch, first extend the primary fixing section of the base through a primary locating hole on a mounting surface and then rotate the base for the two wing sections of the primary fixing section to rotate and upward abut against two lateral sides of the primary fixing hole and be held thereto. Meanwhile, the secondary fixing section is brought to set in a secondary locating hole formed on the mounting surface near one side of the primary locating hole, such that the base is securely fixed to the mounting surface. When it is desired to remove the base from the mounting surface, an operator may pull the unlocking handle, such that the unlocking handle brings the secondary fixing section to release from the secondary locating hole and the base can be rotated in a reverse direction to its initial position. At this point, the two wing sections of the primary fixing section can be moved upward to separate from the primary fixing hole and the base can be removed from the mounting surface.

However, the above latch has the following disadvantages in practical application thereof:

(1) The base must be rotated when being fixed to or removed from the mounting surface, so that the two wing sections are abutted against or released from two lateral sides of the primary locating hole, respectively, to allow subsequent operations. For this purpose, it is necessary to reserve sufficient space on the mounting surface to allow for the rotation of the base. The provision of the wing sections forms a waste of space, which does not satisfy the requirement for compactness in the modern trends of electronic products.

(2) The rotation of the primary fixing section would cause rubbing between the wing sections and the mounting surface, such as a circuit board surface, and frequent rubbing would cause wearing of the circuit board surface.

(3) The latch needs an elastic element disposed between the push button and the base and accordingly, must include a locating mechanism designed according to the elastic element. Therefore, the latch includes various components, which result in complicated structure and time-consuming assembly of the latch, rendering the latch non-economical for use.

In view of the above disadvantages in the prior art fastening or latch structures in application, it is tried by the inventor to develop an improved retaining mechanism to overcome the above disadvantages.

SUMMARY OF THE INVENTION

A primary object of the present invention is to provide a repeatedly, quickly and removably connectable retaining device for holding an electronic card to a substrate. The retaining device includes a seat and a swingable clamp member. The seat is connected to the substrate and has an open topped receiving space and a stop section transversely extending over the open topped receiving space. The swingable clamp member is pivotally connected at a middle section to the seat to be received in the receiving space. The swingable clamp member has a clamping recess and a push section located at its front and rear ends, respectively; and a recessed section located between the clamping recess and the push section. The electronic card has an end plugged into a terminal socket on the substrate and another free end downward pressed against the clamping recess, such that the clamping recess is swung downward to retain the free end of the electronic card in place. The push section can be pressed to tip up the clamping recess, so as to release the electronic card from the retaining device. The above-described retaining device is simple in structure, low in cost, and easy to operate.

Another object of the present invention is to provide the above retaining device, of which the push section is provided on one side facing toward the stop section with a hook-shaped locating section. When the clamping recess retains the free end of the electronic card thereto, the locating section is brought to fitly hook onto the stop section to hold the swingable clamp member in place. When the push section is pressed downward, the locating section is elastically deformed to remove from the stop section, such that the swingable clamp member returns to a swingable state, allowing the clamping recess to tip up and release the electronic card. At this point, the free end of the electronic card automatically tips up under an elastic restoring force applied thereto by the end of the electronic card plugged in the terminal socket.

A further object of the present invention is to provide the above retaining device, of which the seat includes a primary locating section corresponding to a primary engaging section formed on the substrate. The primary locating section includes a column-like support portion downward extended from a bottom thereof, and a coupling portion horizontally located at a distal end of the support portion. The coupling portion has a retaining protrusion provided at a front end thereof; and the primary engaging section on the substrate is in the form of an elongated hollow-out slot. The front end of the coupling portion is slantly extendable through the primary engaging section to a location below a first end of the primary engaging section, and then a rear end of the coupling portion is also extended through the primary engaging section, such that the whole coupling portion is horizontally movable below the substrate from the first end of the primary engaging section in a direction opposed to the retaining protrusion until the rear end of the coupling portion is abutted against an opposed second end of the primary engaging section and the retaining protrusion is snapped into the first end of the primary engaging section. At this point, the seat of the retaining device is fixedly connected to the substrate without the need of using any tool, making the retaining device convenient for use.

The structure and the technical means adopted by the present invention to achieve the above and other objects can be best understood by referring to the following detailed description of the preferred embodiment and the accompanying drawings; wherein

DETAILED DESCRIPTION OF THE PREFERRED EMBODIMENTS

Figure 1:
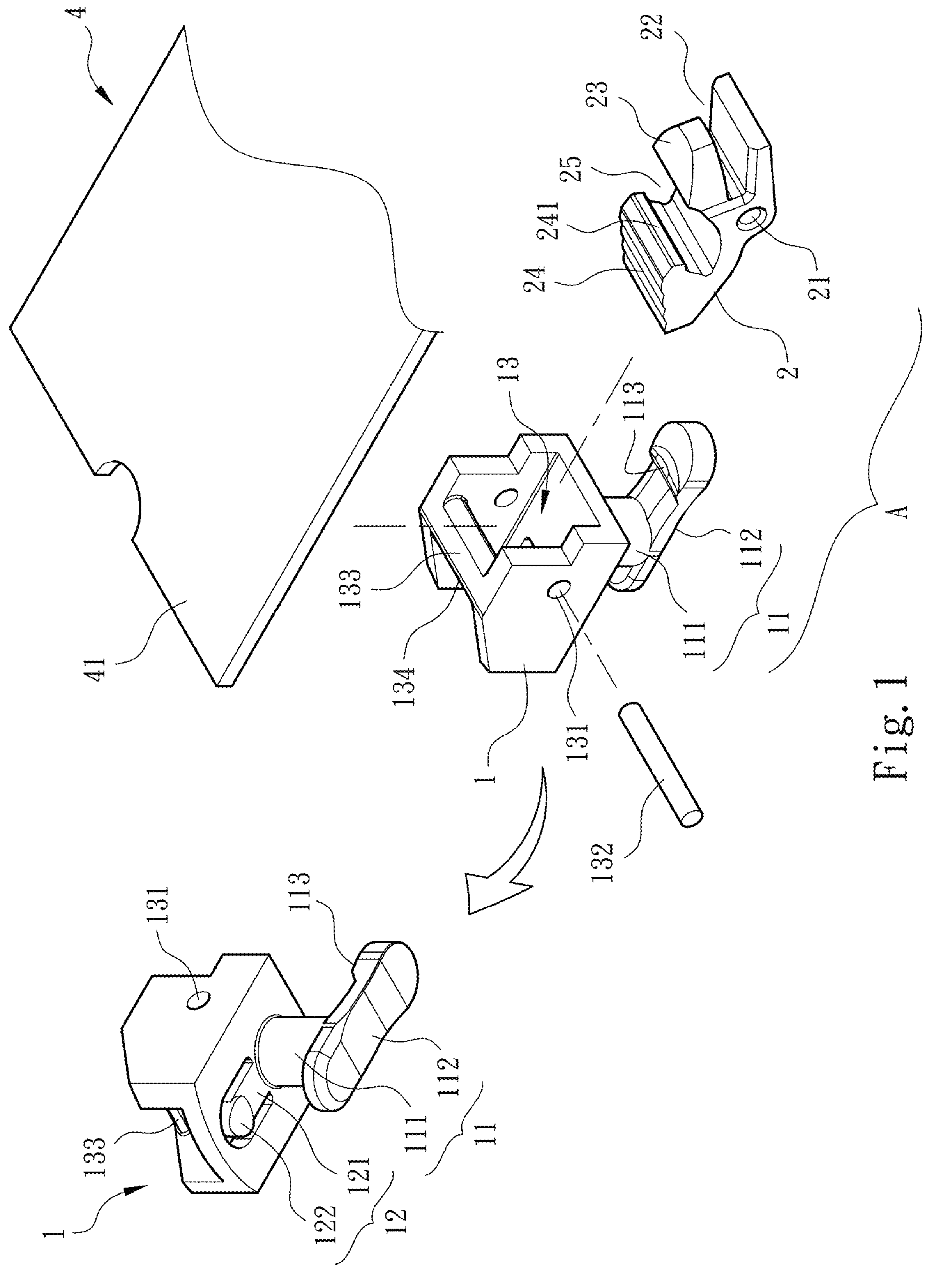
FIG. 1 is an exploded perspective view of a retaining device according to a preferred embodiment of the present invention.
Figure 2:
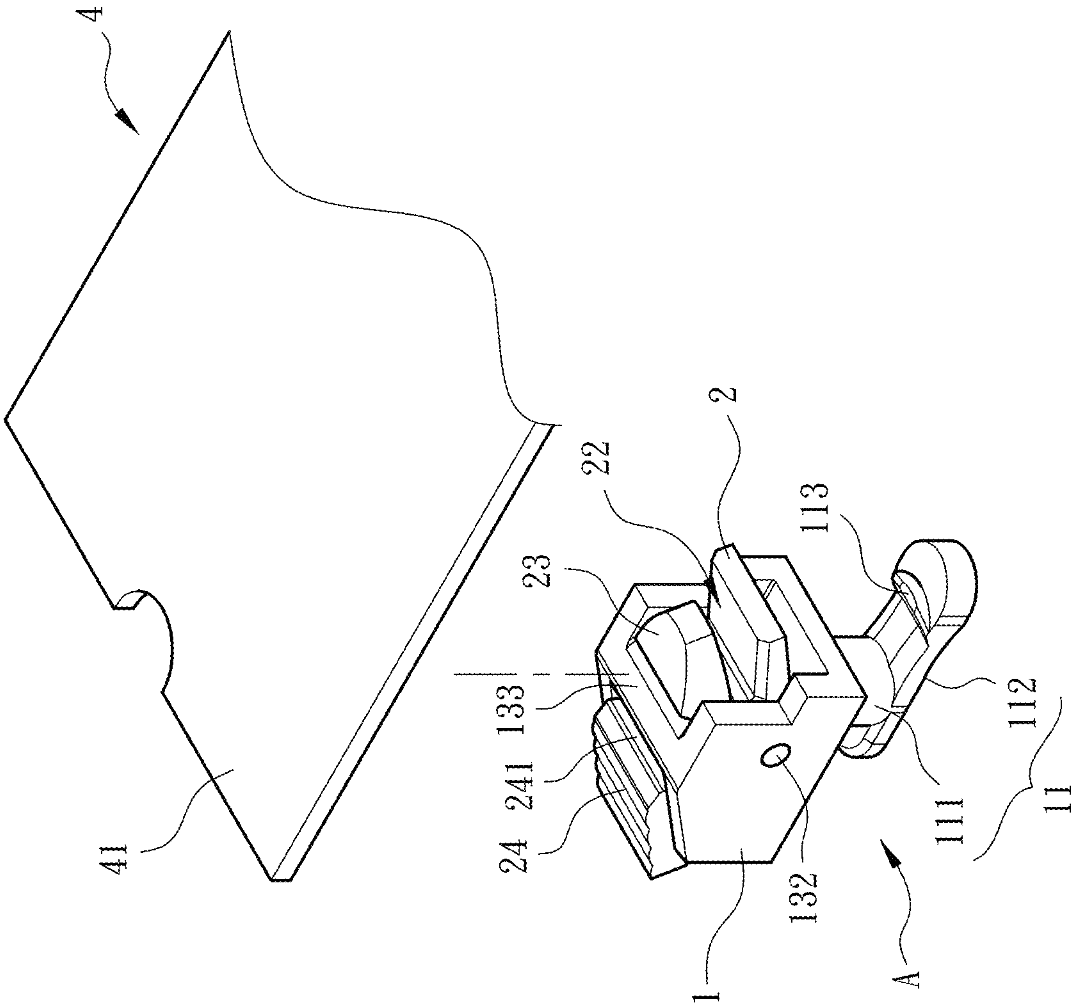
FIG. 2 is an assembled view of FIG. 1.
Figure 3:
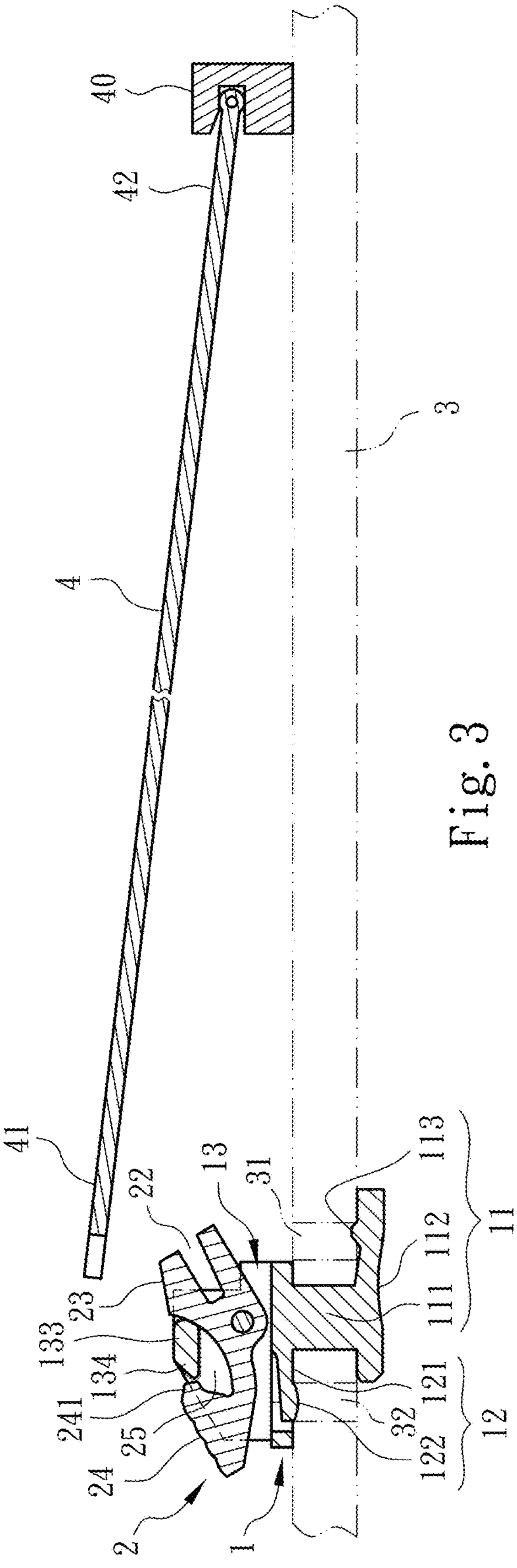
FIG. 3 is a sectional side view showing the retaining device of the present invention is connected to a substrate and ready for retaining an electronic card in place.

Please refer to FIGS. 1, 2 and 3. The present invention is a retaining device A including a seat 1 for connecting to a substrate 3 and a swingable clamp member 2. The seat 1 has a recessed open top formed into a receiving space 13, which has two shaft holes 131 correspondingly formed on two sidewalls thereof for a pivot shaft 132 to extend therethrough. Further, the seat 1 has a stop section 133 transversely located over the open top of the receiving space 13 and extending in parallel with the pivot shaft 132.

The swingable clamp member 2 has a pivot hole 21 transversely extending through a middle section thereof for the pivot shat 132 to fit therein and extend therethrough, such that the swingable clamp member 2 is swingable about the pivot shaft 132 in the receiving space 13. The swingable clamp member 2 has a front end formed into a clamping recess 22, a rear end formed into a push section 24, an intermediate section formed into a recessed portion 25 located between the clamping recess 22 and the push section 24, a pressing section 23 located above the clamping recess 22, and a substantially hook-shaped locating section 241 protruded from one side of the push section 24 facing toward the recessed portion 25. The stop section 133 on the seat 1 is provided on one side facing toward the push section 24 of the swingable clamp member 2 with a downward slantly extended beveled guiding surface 134.

In an operable embodiment, the seat 1 includes a primary locating section 11 downward extended from a bottom of the seat 1 for coupling with a primary engaging section 31 correspondingly formed on the substrate 3 and accordingly be fixedly connected to the substrate 3. In the illustrated preferred embodiment, the primary locating section 11 includes a downward extended column-like support portion 111 and an elongated flexible coupling portion 112 horizontally located at a distal end of the support portion 111. The coupling portion 112 is provided at a front end thereof with an upward retaining protrusion 113. The primary engaging section 31 on the substrate 3 is in the form of an elongated hollow-out slot, which has a length smaller than that of the coupling portion 112.

To connect the retaining device A to the substrate 3, first slantly extend the front end of the coupling portion 112 having the retaining protrusion 113 provided thereat through the elongated hollow-out slot of the primary engaging section 31 to a location below a first end of the primary engaging section 31, and then further extend a rear end of the coupling portion 112 through the elongated hollow-out slot of the primary engaging section 31. At this point, the whole coupling portion 112 is horizontally movable below the substrate 3 from the first end of the elongated hollow-out slot of the primary engaging section 31 in a direction opposite to the retaining protrusion 113 until the rear end of the coupling portion 112 is abutted against a lower side of the substrate 3 located adjacent to a second end of the primary engaging section 31 and the retaining protrusion 113 is snapped into the first end of the elongated hollow-out slot of the primary engaging section 31 and held in place. In this manner, the seat 1 can be securely connected to the substrate 3.

In the above structure, the seat 1 may further include a secondary locating section 12 according to actual need, and the substrate 3 may also be correspondingly provided with a secondary engaging section 32. In the illustrated preferred embodiment, the secondary engaging section 32 is a locating bore, and the secondary locating section 12 includes a spring plate 121 having a locating protrusion 122 provided at an end thereof to face toward the coupling portion 112. When the seat 1 is connected to the substrate 3 and held in place, the locating protrusion 122 is fitly snapped into the locating bore of the secondary engaging section 32 to serve as an assistant locating mechanism of the primary locating section 11.

Figure 4:
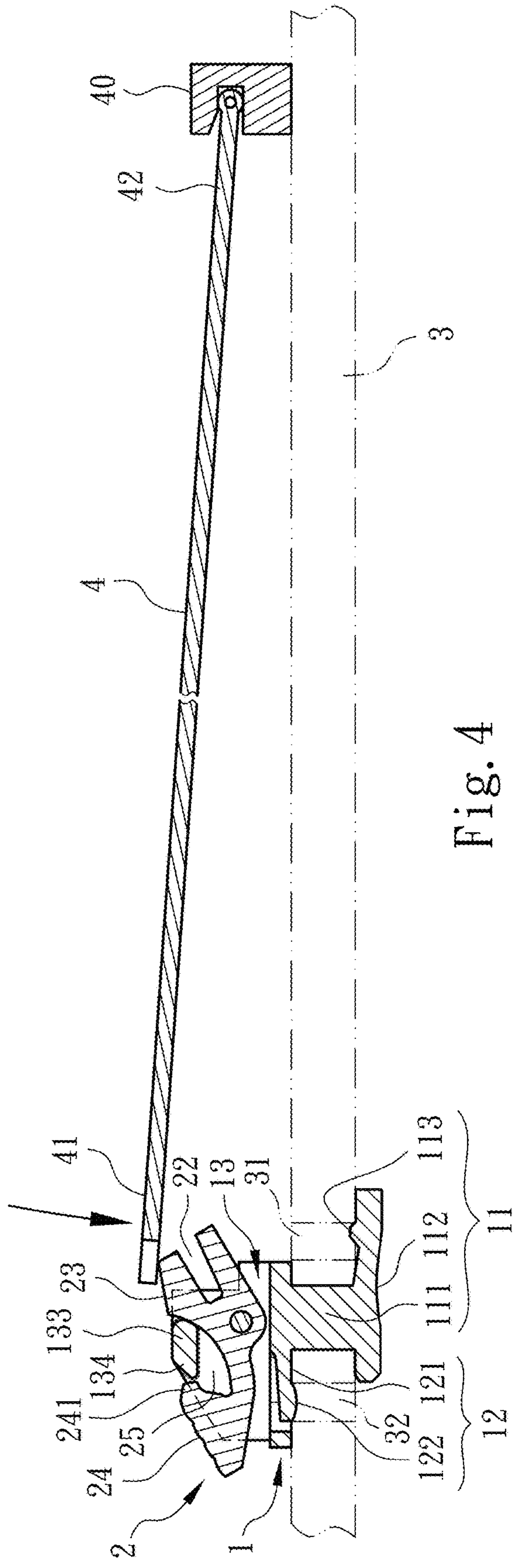
FIG. 4 is a sectional side view showing the electronic card is pressed downward to contact with the retaining device of the present invention.

Please refer to FIGS. 3 to 6. When the retaining device of the present invention is practically used to retain an electronic card 4, such as a solid state drive, to the substrate 3, an electrical connecting end 42 of the electronic card 4 having pins provided thereat is plugged into a terminal socket 40 on the substrate 3 to elastically tip up another engaging end 41 of the electronic card 4 that can be pressed downward, as shown in FIG. 3. When the engaging end 41 of the electronic card 4 is brought to contact with and push the pressing section 23 of the swingable clamp member 2 downward, as shown in FIG. 4, the push section 24 at the rear end of the swingable clamp member 2 gradually swings upward.

Figure 5:
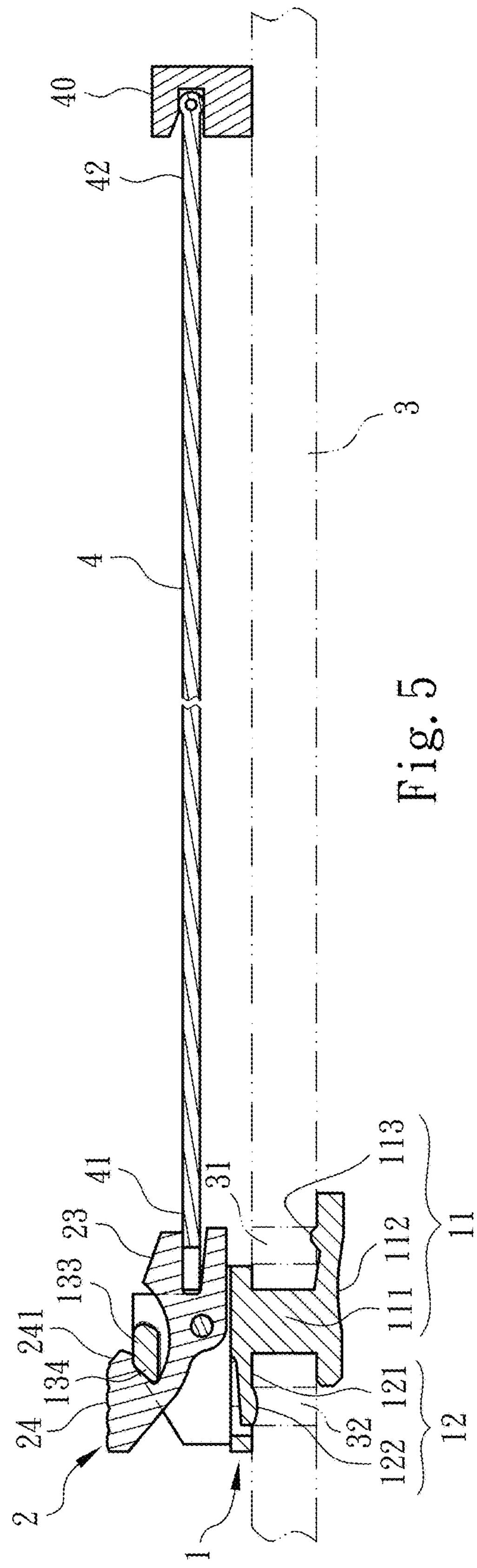
FIG. 5 is a sectional side view showing the electronic card is fully pressed downward and is held in place by the retaining device of the present invention.

When the swingable clamp member 2 is pivotally turned to a clamp position capable of clamping the electronic card 4 thereto, the engaging end 41 of the electronic card 4 passes over the pressing section 23 to be set in the clamping recess 22. At this point, the pressing section 23 is abutted on an edge of the engaging end 41 of the electronic card 4 to hold the electronic card 4 in place. Meanwhile, the locating section 241 of the push section 24 on the swingable clamp member 2 is upwardly pressed against the stop section 133 of the seat 1 and deformed elastically to finally pass over the beveled guiding surface 134 and fixedly hook onto the stop section 133. In this manner, the electronic card 4 is retained to the substrate 3 at a position for operating normally, as shown in FIG. 5.

Figure 6:
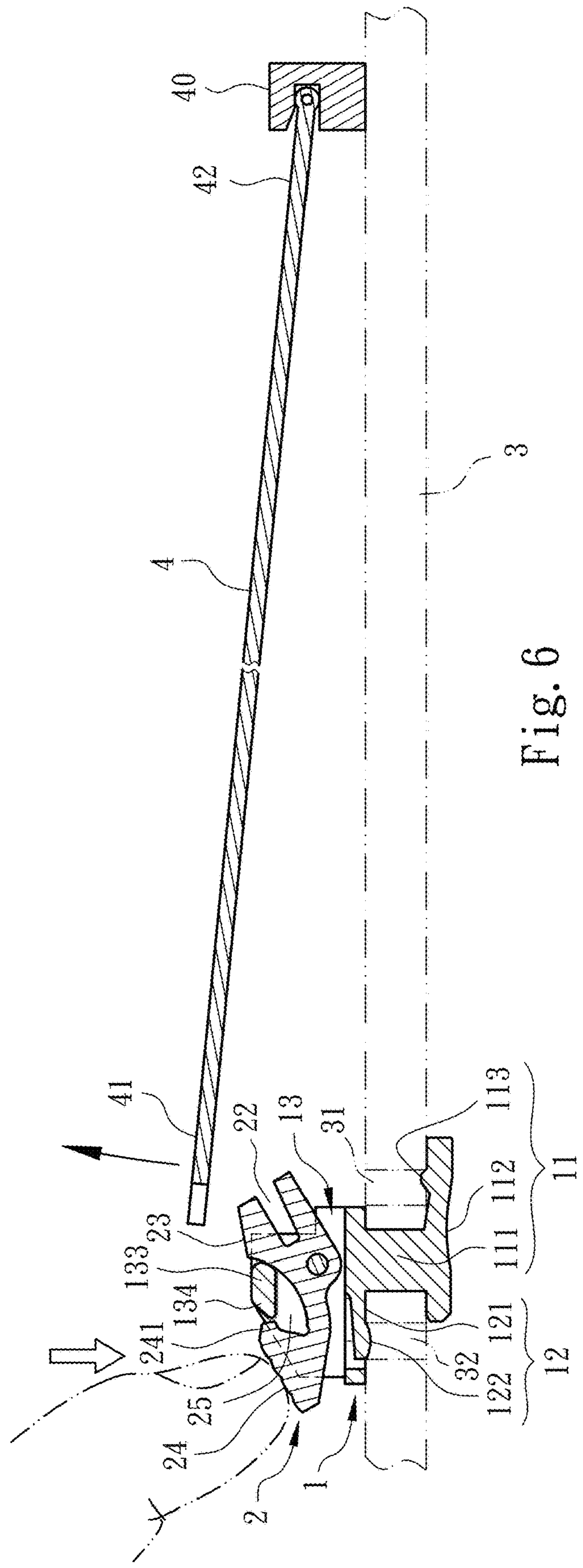
FIG. 6 is a sectional side view showing the electronic card is released from the retaining device and elastically tips up to an initial position not pressed downward by the electronic card.

On the other hand, when it is desired to remove the electronic card 4 from the substrate 3, simply apply an external force on the push section 24 at the rear end of the swingable clamp member 2 for the locating section 241 to move rearward across the beveled guiding surface 134 and separate from the stop section 133. At this point, the clamping recess 22 at the front end of the swingable clamp member 2 is tipped up to a release position, and the pressing section 23 is no longer abutted on the edge of the engaging end 41 of the electronic card 4. At this point, the engaging end 41 automatically tips up due to an elastic restoring force generated when the electrical connecting end 42 is plugged into the terminal socket 40 and can be easily removed from the substrate 3, as shown in FIG. 6.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A repeatedly, quickly and removably connectable retaining device, comprising:
- a seat having a recessed open top to define a receiving space thereon, and the seat including a stop section extending transversely over the open top of the receiving space, wherein the seat is formed of a single construction; and
- a swingable clamp member being pivotally connected at a middle section to the seat via a pivot shaft to be located in the receiving space;
- the swingable clamp member having a front end formed into a clamping recess and a rear end formed into a push section, and being pivotally swingable under a force externally applied thereto, thereby the push section is detachably pressed against the stop section and the clamping recess is movable between a clamp position and a release position.

2. The retaining device as claimed in claim 1, wherein the swingable clamp member includes a recessed portion formed between the clamping recess and the push section for receiving the stop section therein; the push section including a hook-shaped locating section formed on one side facing toward the recessed portion for hooking onto the stop section, that thereby the clamping recess of the swingable clamp member is held to the clamp position.

3. The retaining device as claimed in claim 2, wherein the stop section on the seat is provided on one side facing toward the push section of the swingable clamp member with a downward slantly extended beveled guiding surface; and the beveled guiding surface guiding the locating section of the push section to deform elastically while moving rearward, thereby the push section is separable from the stop section and brings the clamping recess to swing back to the release position.

4. The retaining device as claimed in claim 3, wherein the seat is connected to a substrate and includes a primary locating section extended downward from a bottom thereof; the primary locating section including a column-like support portion and an elongated coupling portion horizontally located at a distal end of the support portion, and the coupling portion being provided at a front end thereof with a retaining protrusion; the substrate being provided with a primary engaging section formed as an elongated hollow-out slot; the front end of the coupling portion having the retaining protrusion provided thereat being slantly extendable through the hollow-out elongated slot of the primary engaging section to a location below a first end of the primary engaging section, and a rear end of the coupling portion being also extended through the elongated hollow-out slot of the primary engaging section; thereby the coupling portion is horizontally movable below the substrate from the first end of the primary engaging section in a direction opposed to the retaining protrusion until the rear end of the coupling portion is abutted against an opposed second end of the primary engaging section and the retaining protrusion is snapped into the first end of the primary engaging section, bringing the seat to be fixedly connected the substrate.

5. The retaining device as claimed in claim 4, wherein the seat is provided on the bottom with a secondary locating section formed as a spring plate, and the substrate is provided on a corresponding side of the primary engaging section with a secondary engaging section formed as a locating bore; the spring plate including a locating protrusion located on a free end thereof to face towards the coupling portion, and the locating protrusion being snapped into the secondary engaging section when the seat is fixedly connected to the substrate.

6. The retaining device as claimed in claim 2, wherein the swingable clamp member includes a pressing section located above the clamping recess; and the pressing section being fitly abutted on a top of an electronic card when the clamping recess of the swingable clamp member is held to the clamp position and clamps an edge of the electronic card thereto.

7. The retaining device as claimed in claim 6, wherein the seat is connected to a substrate and includes a primary locating section extended downward from a bottom thereof; the primary locating section including a column-like support portion and an elongated coupling portion horizontally located at a distal end of the support portion, and the coupling portion being provided at a front end thereof with a retaining protrusion; the substrate being provided with a primary engaging section formed as an elongated hollow-out slot; the front end of the coupling portion having the retaining protrusion provided thereat being slantly extendable through the hollow-out elongated slot of the primary engaging section to a location below a first end of the primary engaging section, and a rear end of the coupling portion being also extended through the elongated hollow-out slot of the primary engaging section; thereby the coupling portion is horizontally movable below the substrate from the first end of the primary engaging section in a direction opposed to the retaining protrusion until the rear end of the coupling portion is abutted against an opposed second end of the primary engaging section and the retaining protrusion is snapped into the first end of the primary engaging section, bringing the seat to be fixedly connected to the substrate.

8. The retaining device as claimed in claim 7, wherein the seat is provided on the bottom with a secondary locating section formed as a spring plate, and the substrate is provided on a corresponding side of the primary engaging section with a secondary engaging section formed as a locating bore; the spring plate including a locating protrusion located on a free end thereof to face towards the coupling portion, and the locating protrusion being snapped into the secondary engaging section when the seat is fixedly connected to the substrate.

9. The retaining device as claimed in claim 2, wherein the seat is connected to a substrate and includes a primary locating section extended downward from a bottom thereof; the primary locating section including a column-like support portion and an elongated coupling portion horizontally located at a distal end of the support portion, and the coupling portion being provided at a front end thereof with a retaining protrusion; the substrate being provided with a primary engaging section formed as an elongated hollow-out slot; the front end of the coupling portion having the retaining protrusion provided thereat being slantly extendable through the hollow-out elongated slot of the primary engaging section to a location below a first end of the primary engaging section, and a rear end of the coupling portion being also extended through the elongated hollow-out slot of the primary engaging section; thereby the coupling portion is horizontally movable below the substrate from the first end of the primary engaging section in a direction opposed to the retaining protrusion until the rear end of the coupling portion is abutted against an opposed second end of the primary engaging section and the retaining protrusion is snapped into the first end of the primary engaging section, bringing the seat to be fixedly connected the substrate.

10. The retaining device as claimed in claim 9, wherein the seat is provided on the bottom with a secondary locating section formed as a spring plate, and the substrate is provided on a corresponding side of the primary engaging section with a secondary engaging section formed as a locating bore; the spring plate including a locating protrusion located on a free end thereof to face towards the coupling portion, and the locating protrusion being snapped into the secondary engaging section when the seat is fixedly connected to the substrate.

11. The retaining device as claimed in claim 1, wherein the seat is connected to a substrate and includes a primary locating section extended downward from a bottom thereof; the primary locating section including a column-like support portion and an elongated coupling portion horizontally located at a distal end of the support portion, and the coupling portion being provided at a front end thereof with a retaining protrusion; the substrate being provided with a primary engaging section formed as an elongated hollow-out slot; the front end of the coupling portion having the retaining protrusion provided thereat being slantly extendable through the hollow-out elongated slot of the primary engaging section to a location below a first end of the primary engaging section, and a rear end of the coupling portion being also extended through the elongated hollow-out slot of the primary engaging section; thereby the coupling portion is horizontally movable below the substrate from the first end of the primary engaging section in a direction opposed to the retaining protrusion until the rear end of the coupling portion is abutted against an opposed second end of the primary engaging section and the retaining protrusion is snapped into the first end of the primary engaging section, bringing the seat to be fixedly connected the substrate.

12. The retaining device as claimed in claim 11, wherein the seat is provided on the bottom with a secondary locating section formed as a spring plate, and the substrate is provided on a corresponding side of the primary engaging section with a secondary engaging section formed as a locating bore; the spring plate including a locating protrusion located on a free end thereof to face towards the coupling portion, and the locating protrusion being snapped into the secondary engaging section when the seat is fixedly connected to the substrate.

* * * * *